US012543261B2

(12) United States Patent
Yoo et al.

(10) Patent No.: US 12,543,261 B2
(45) Date of Patent: Feb. 3, 2026

(54) SOLDER MASK FAULT FIBER OPTICS SENSOR

(71) Applicant: Micron Technology, Inc., Boise, ID (US)

(72) Inventors: Chan H. Yoo, Boise, ID (US); James M. Derderian, Boise, ID (US); Walter L. Moden, Boise, ID (US); Christopher Glancey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 18/436,892

(22) Filed: Feb. 8, 2024

(65) Prior Publication Data

US 2024/0284590 A1 Aug. 22, 2024

Related U.S. Application Data

(60) Provisional application No. 63/446,204, filed on Feb. 16, 2023.

(51) Int. Cl.
*H05K 1/02* (2006.01)
*G01R 31/309* (2006.01)
*H05K 3/28* (2006.01)

(52) U.S. Cl.
CPC ......... *H05K 1/0269* (2013.01); *G01R 31/309* (2013.01); *H05K 3/28* (2013.01)

(58) Field of Classification Search
CPC ........ H05K 1/0269; H05K 3/28; H05K 3/284; H05K 2201/10159; H05K 1/0274
See application file for complete search history.

(56) References Cited

U.S. PATENT DOCUMENTS

| | | |
|---|---|---|
| 5,142,141 A | 8/1992 | Talat et al. |
| 5,308,973 A | 5/1994 | Odoni et al. |
| 5,723,857 A | 3/1998 | Underwood et al. |
| 6,927,484 B2 | 8/2005 | Hetzel et al. |

(Continued)

FOREIGN PATENT DOCUMENTS

WO 2024173144 8/2024

OTHER PUBLICATIONS

"International Application Serial No. PCT US2024 015016, International Search Report mailed Jun. 18, 2024", 3 pgs.

(Continued)

*Primary Examiner* — Sherman Ng
(74) *Attorney, Agent, or Firm* — Schwegman Lundberg & Woessner, P.A.

(57) ABSTRACT

Aspects of the present disclosure configure a processor to detect faults in a printed circuit board (PCB) solder mask using an optical waveguide. The processor directs an optical beam to an input of one or more optical waveguides embedded in a protective coating layer of a PCB, the protective coating layer being adjacent to one or more traces of the PCB. The processor measures a beam characteristic of the optical beam that is output by the one or more optical waveguides. The processor detects a disruption of the optical beam that is output by the one or more optical waveguides based on the beam characteristic. The processor detects a fault in the protective coating layer of the PCB based on detecting the disruption of the optical beam that is output by the one or more optical waveguides.

14 Claims, 7 Drawing Sheets

(56) References Cited

U.S. PATENT DOCUMENTS

2008/0044127 A1* 2/2008 Leising .................... G02B 6/43
                                                      385/14
2011/0062563 A1    3/2011 Yang et al.
2017/0351042 A1* 12/2017 Campbell .............. G02B 6/428

OTHER PUBLICATIONS

"International Application Serial No. PCT US2024 015016, Written Opinion mailed Jun. 18, 2024", 5 pgs.

* cited by examiner

SOLDER MASK FAULT FIBER OPTICS SENSOR

PRIORITY APPLICATION

This application claims the benefit of priority to U.S. Provisional Application Ser. No. 63/446,204, filed Feb. 16, 2023, which is incorporated herein by reference in its entirety.

TECHNICAL FIELD

Embodiments of the disclosure relate generally to memory sub-systems and, more specifically, to detecting physical faults, such as cracks, in printed circuit boards (PCBs) that implement the memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
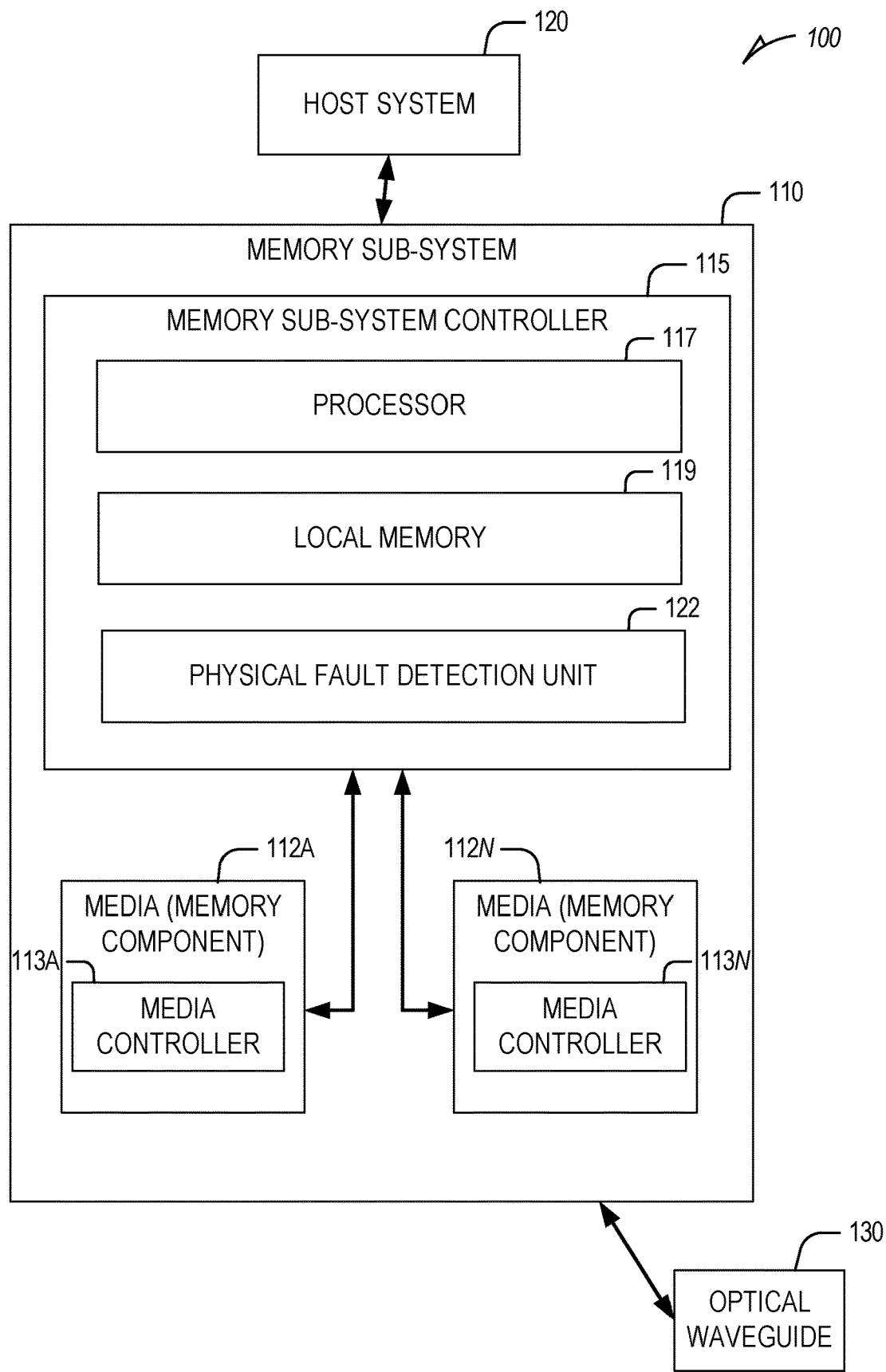
FIG. 1 is a block diagram illustrating an example computing environment including a memory sub-system, in accordance with some embodiments of the present disclosure.

Aspects of the present disclosure configure a system component, such as a processor, to detect physical faults in a PCB using an optical waveguide or multiple optical waveguides. The PCB can include multiple layers including a layer with traces (e.g., conducting metal interconnects), a layer with a protective coating embedded with an optical waveguide, and a layer with various physical components (e.g., a memory sub-system component and/or processing device component). A laser can generate a beam of light that passes through the optical waveguide. The processor can measure or detect disruptions in the beam of light, such as based on differences between beam characteristics (e.g., frequency, attenuation, and/or intensity) of light that enters the optical waveguide and light that exits the optical waveguide. In response to and based on such differences in beam characteristics, the processor can identify existence of and/or physical locations of physical faults (e.g., cracks) in the protective coating and/or the traces. These physical faults can then be corrected at manufacture and/or during operation to, for example, prevent damage to components of the PCB or data transfer faults between components connected on the PCB. This improves the overall efficiency of operating and implementing the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data."

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data." "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies) or other physical component(s). Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package.

There are challenges in efficiently managing or performing media management operations on typical memory devices in case of physical faults on the PCB on which the memory device and/or memory controller are implemented. Specifically, typical memory sub-systems are implemented on a PCB and distribute the components on the PCB. The various components on the PCB are interconnected with physical wires or conducting traces. These wires and traces can be exposed to various environments and can sometimes get damaged. To reduce damage to the traces, a protective coating in the form of a solder mask layer (which can include various resins) can be placed on top of and/or underneath the wires and traces. While this coating can help reduce some of the physical stress the PCB encounters in an environment and reduce damage to the wires and traces, in many cases physical cracks can still form in the protective coating. The cracks can end up damaging or causing corrosion to the physical wires and traces which can introduce faulty operations and additional errors in the memory devices. Detecting the existence of such cracks or other physical faults is incredibly difficult at manufacture and, even worse, during operation of the PCB. Usually, when damage results from such cracking, the PCB is discarded, which can waste resources.

Aspects of the present disclosure address the above and other deficiencies by providing an optical waveguide or multiple optical waveguides embedded in the protective coating of the PCB. The present disclosure can generate a laser or other beam of light to pass through the optical waveguide. A processor can measure or detect disruptions in the beam of light, such as based on differences between beam characteristics (e.g., frequency, attenuation, and/or intensity) of light that enters the optical waveguide and light that exits the optical waveguide. In response to and based on such differences in beam characteristics, the processor can identify existence of and/or physical locations of physical faults (e.g., cracks) in the protective coating and/or the traces. These physical faults can then be corrected at manufacture and/or during operation to, for example, prevent damage to components of the PCB or data transfer faults between components connected on the PCB. This increases the efficiency of operating memory systems, can reduce the amount of physical resources consumed by the memory sub-systems, and avoids waste. Namely, by detecting cracks using the optical waveguide in the protective coating layer on the PCB, the protective coating layer can be repaired or replaced to avoid damage to the traces or wires, which avoids having to discard the PCB due to failure as a result of such cracks.

In some examples, a system including a PCB with a plurality of layers is provided. The system includes a plurality of traces including a first layer of the plurality of layers. The plurality of traces can couple one or more physical components including a set of memory components of a memory sub-system to a processing device. The system includes a protective coating including a second layer of the plurality of layers. The protective coating can be adjacent to (above and/or beneath) the plurality of traces. One or more optical waveguides can be embedded in the protective coating. The one or more optical waveguides can be configured to enable detection of a fault associated with the protective coating based on disruption of an optical beam passing through the one or more optical waveguides.

In some examples, the one or more physical components and the processing device are on a third layer of the plurality of layers. The third layer can be adjacent to the protective coating. In some examples, the one or more physical components and the processing device are arranged in a stack. In some examples, the fault includes a crack in the protective coating. In some examples, the fault includes a crack in the plurality of traces. In some examples, the protective coating includes a solder mask layer.

In some examples, the system includes an additional set of optical waveguides embedded in an additional protective coating including a third layer of the plurality of layers. In some examples, the plurality of traces is physically between the second layer and the third layer.

In some examples, the system includes a laser for generating the optical beam. The system includes a first lens for receiving the optical beam from the laser and passing the optical beam to a polarizer. The system includes a second lens for receiving the optical beam passing through the polarizer for directing the optical beam to an input of the one or more optical waveguides. In some examples, the system includes a third lens for receiving the optical beam that is output from the one or more optical waveguides and a sensor for receiving the optical beam that passes through the third lens. The sensor can be configured to detect the disruption of the optical beam relative to the optical beam generated by the laser.

In some examples, the sensor is configured to perform operations including measuring a time of flight of the optical beam and determining a physical location of the fault based on the time of flight of the optical beam. In some examples, the one or more optical waveguides include a plurality of optical waveguides. The sensor can be configured to perform operations including measuring a frequency or attenuation of the optical beam received from each of the plurality of optical waveguides. The operations can include determining that the frequency or attenuation of the optical beam output by an individual optical waveguide of the plurality of optical waveguides differs from the frequency or attenuation of the optical beam output by remaining optical waveguides of the plurality of optical waveguides. The operations can include identifying a physical location of the fault based on physical positioning of the individual optical waveguide based on determining that the frequency or intensity of the optical beam output by the individual optical waveguide differs from the frequency or intensity of the optical beam output by the remaining optical waveguides.

In some examples, the one or more optical waveguides include a grid of optical waveguides. The sensor can be configured to perform operations including measuring a frequency or attenuation of the optical beam received from each of the grid of optical waveguides and determining that the frequency or attenuation of the optical beam output by a pair of individual optical waveguides of the plurality of optical waveguides differs from the frequency or attenuation of the optical beam output by remaining optical waveguides of the plurality of optical waveguides. The operations can include identifying a physical location of the fault based on physical positioning of a point of intersection between the pair of optical waveguides.

In some examples, the one or more optical waveguides are placed in regions of the PCB associated with greater likelihoods of faults, such as critical regions including edges or corners of the PCB. In some examples, the one or more optical waveguides include one or more glass fibers or fiberglass or fiberoptic cables.

In some examples, the disclosed techniques direct an optical beam to an input of one or more optical waveguides embedded in a protective coating layer of PCB. The protective coating layer can be adjacent to one or more traces of the PCB. The disclosed techniques measure a beam characteristic of the optical beam that is output by the one or more optical waveguides and detect a disruption of the optical beam that is output by the one or more optical waveguides based on the beam characteristic. The disclosed techniques detect a fault in the protective coating layer of the PCB based on detecting the disruption of the optical beam that is output by the one or more optical waveguides.

In some examples, the disclosed techniques generate the optical beam by a laser and pass the optical beam through a first lens and then through a polarizer. The disclosed techniques pass the optical beam output by the polarizer through a second lens to direct the optical beam to the input of the one or more optical waveguides.

In some examples, the techniques described herein relate to a method of manufacturing a PCB including a memory system. The disclosed techniques place a plurality of traces including a first layer of a plurality of layers on a PCB. The plurality of traces couple one or more physical components including a set of memory components of a memory sub-system to a processing device. The disclosed techniques deposit a protective coating including a second layer of the plurality of layers. The protective coating can be adjacent to the plurality of traces. The disclosed techniques embed one or more optical waveguides in the protective coating. The one or more optical waveguides can be configured to enable detection of a fault associated with the protective coating based on disruption of an optical beam passing through the one or more optical waveguides.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies). These individual dies can be coupled to each other on an integrated circuit and placed as separate or combined components on a PCB.

In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more of the memory sub-system 110. In some embodiments, the host system 120 is coupled to different types of the memory sub-system 110. FIG. 1 illustrates one example of a host system 120 coupled to one instance of the memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical (conductive traces), optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, an M.2 SSD interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface and/or M.2 SSD interface. The physical host interface can provide an interface for passing control, address, data, and other signals between the memory sub-system 110 and the host system 120. The memory sub-system 110 can be implemented on a PCB that is coupled to the host system 120 via a specified interface, such as the M.2 SSD interface.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random-access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, and/or different dynamic data refresh.

The memory sub-system controller 115 can include hardware such as one or more integrated circuits and/or discrete components, a physical fault detection unit 122, an optical waveguide 130, a buffer memory, and/or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode with instructions for the memory sub-system controller 115 to execute, such as firmware. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other memory management operations, such as wear leveling operations, garbage collection operations, error detection and error-correcting code (ECC) operations, encryption operations, caching operations, memory components 112A to 112N initialization, and/or address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120. The memory sub-system controller 115 can include a memory interface to communicate with the memory components 112A to 112N. Any component included as part of the memory sub-system controller 115 can be included in the memory interface and vice versa.

The memory sub-system 110 can also include additional circuitry or components that are not illustrated, such as capacitors, resistors, transistors, and various other active or passive devices. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which are raw memory devices combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a physical fault detection unit 122 that is coupled to an optical waveguide 130. In some cases, the physical fault detection unit 122 can be a separate physical component from the components of the memory sub-system controller 115 and/or can include some components implemented as part of the memory sub-system controller 115 and some components implemented outside of the memory sub-system 110. In some cases, the physical fault detection unit 122 and the components of the memory sub-system controller 115 are implemented by the same physical device or integrated circuit. The optical waveguide 130 is a separate physical device from the physical fault detection unit 122 and/or the memory sub-system controller 115. The optical waveguide 130 is embedded in a protective coating layer that is deposited on top of and/or underneath conductive traces (in a conductive trace layer) of the PCB.

In one example, the optical waveguide 130 can be implemented using one or more fiberoptic cables/wires, such as glass fibers. The optical waveguide 130 includes a specified refractive index that allows a beam of light to enter the optical waveguide 130 and pass through the optical waveguide 130 to exit the optical waveguide 130 with minimal or no loss in intensity (e.g., with minimal attenuation) and/or without changing a frequency of the beam of light. The optical waveguide 130 can include a weave or grid of multiple such fiberoptic cables or wires or any other suitable arrangement of fiberoptic cables or wires. In some cases, the optical waveguide 130 includes a single fiberoptic cable or wire.

The physical fault detection unit 122 can generate or active a laser to generate a beam of light and pass the beam of light through a series of lenses and one or more polarizers to enter each one of the one or more fiberoptic cables/wires of the optical waveguide 130. The physical fault detection unit 122 can communicate with a sensor at an output of the optical waveguide 130 to determine whether any attenuation and/or change in frequency has occurred in the beam of light at the output of the optical waveguide 130 relative to the beam of light at the input of the optical waveguide 130. In response to determining that the sensor detected a change and that the change transgresses a specified threshold, the physical fault detection unit 122 can determine that a physical fault exists in the protective coating layer in which the optical waveguide 130 is embedded. For example, if a crack is present in the protective coating layer, the crack can disrupt the beam of light, which causes the beam of light to be attenuated and/or have a change in frequency. Based on time of flight information or measurements associated with the beam of light, the physical fault detection unit 122 can determine and pinpoint the physical location of the physical fault and can trigger or generate an alert to an operator. In this way, the physical fault can be corrected with minimal cost and before damage occurs in the conductive trace layer that interconnects various physical components of the memory sub-system 110 and the host system 120.

In some examples, in addition to or alternative to using time of flight information or measurements, the physical fault detection unit 122 can communicate with the sensor to identify which one of a plurality of fiberoptic cables or wires had a change in the attenuation or frequency in the beam of light relative to a remaining set of the plurality of fiberoptic cables. For example, if there exist 100 fiberoptic cables in the optical waveguide 130 and a change in attenuation or frequency is detected in a subset (e.g., 2 out of the 100) cables, the physical fault detection unit 122 can determine the physical location of the subset of cables. The physical fault detection unit 122 can estimate the physical location of the physical fault to be along a path traversed by the subset of cables. In some cases, the plurality of fiberoptic cables is arranged in a weave or grid. In such cases, the physical fault detection unit 122 can determine a point of intersection between two or more of the plurality of fiberoptic cables. The point of intersection can represent the physical location of the physical fault.

Depending on the embodiment, the physical fault detection unit 122 can comprise logic (e.g., a set of transitory or non-transitory machine instructions, such as firmware) or one or more components that causes the physical fault detection unit 122 to perform operations described herein. The physical fault detection unit 122 can comprise a tangible or non-tangible unit capable of performing operations described herein.

For example, the PCB on which the host system 120 and/or the memory sub-system 110 are implemented can include a plurality of layers. A plurality of traces including a first layer of the plurality of layers couple one or more physical components including a set of memory components (e.g., memory components 112A to 112N) of a memory sub-system 110 to a processing device, such as processor 117. A protective coating including a second layer of the plurality of layers can be adjacent to the plurality of traces and one or more optical waveguides, such as optical waveguide 130, can be embedded in the protective coating. The one or more optical waveguides can be configured to enable detection of a physical fault associated with the protective coating based on disruption of an optical beam passing through the one or more optical waveguides.

The one or more physical components on the PCB and the processing device can be on a third layer of the plurality of layers that is adjacent to the protective coating. In some embodiments the one or more physical components and the processing device can be arranged in a stack. The protective coating can include a solder mask layer, which can include a polymer material or other non-conductive material that is deposited on top of or underneath the conductive traces.

The PCB can include an additional set of optical waveguides embedded in an additional protective coating including a third layer of the plurality of layers. For example, a first protective coating layer can be deposited below the conductive traces on the PCB and a second protective coating layer can be deposited on top of the conductive traces. In this way, the conductive traces are sandwiched between two protective coating layers. Each of the first and second protective coating layers can include a respective set of the optical waveguide 130. By passing a beam of light through the optical waveguide 130 in the first and second protective coating layers, a physical fault in the protective coating layers and/or the conductive traces can be detected and identified for correction.

In some examples, a laser external or internal to the memory sub-system 110 is provided for generating the optical beam. A first lens can be positioned for receiving the optical beam from the laser and passing the optical beam to a polarizer. A second lens can be positioned for receiving the optical beam passing through the polarizer for directing the optical beam to an input of the optical waveguide 130. A third lens can be positioned for receiving the optical beam that is output from the optical waveguide 130, and a sensor can be positioned for receiving the optical beam that passes through the third lens. The sensor can be configured to detect the disruption (e.g., change in attenuation or change in frequency) of the optical beam relative to the optical beam generated by the laser.

The sensor can be configured to measure a time of flight of the optical beam and determine a physical location of the fault based on the time of flight of the optical beam. The optical waveguide 130 can include a plurality of optical waveguides, and the sensor can measure a frequency or attenuation of the optical beam received from each of the plurality of optical waveguides. The sensor can determine that the frequency or attenuation of the optical beam output by an individual optical waveguide of the plurality of optical waveguides differs from the frequency or attenuation of the optical beam output by remaining optical waveguides of the plurality of optical waveguides to identify a physical location of the fault. In some cases, the optical waveguide 130 includes a grid of optical waveguides and the sensor can measure a frequency or attenuation of the optical beam received from each of the grid of optical waveguides and determine that the frequency or attenuation of the optical beam output by a pair of individual optical waveguides of the plurality of optical waveguides differs from the frequency or attenuation of the optical beam output by remaining optical waveguides of the plurality of optical waveguides. This allows the sensor to identify a physical location of the fault based on physical positioning of a point of intersection between the pair of optical waveguides.

In some examples, the physical fault detection unit 122 directs an optical beam to an input of the optical waveguide 130 embedded in a protective coating layer of the PCB. The physical fault detection unit 122 measures a beam characteristic (e.g., attenuation or frequency change) of the optical beam that is output by the one or more optical waveguides. The physical fault detection unit 122 detects a disruption of the optical beam that is output by the one or more optical waveguides based on the beam characteristic and detects a physical fault in the protective coating layer of the PCB based on detecting the disruption of the optical beam that is output by the optical waveguide 130.

In some examples, the PCB including the memory sub-system 110 is manufactured by placing a plurality of traces including a first layer of a plurality of layers on the PCB, the plurality of traces coupling one or more physical components including a set of memory components of a memory sub-system to a processing device. A protective coating is deposited including a second layer of the plurality of layers, the protective coating being adjacent to the plurality of traces. One or more optical waveguides are embedded in the protective coating, the one or more optical waveguides being configured to enable detection of a fault associated with the protective coating based on disruption of an optical beam passing through the one or more optical waveguides.

Figure 2:
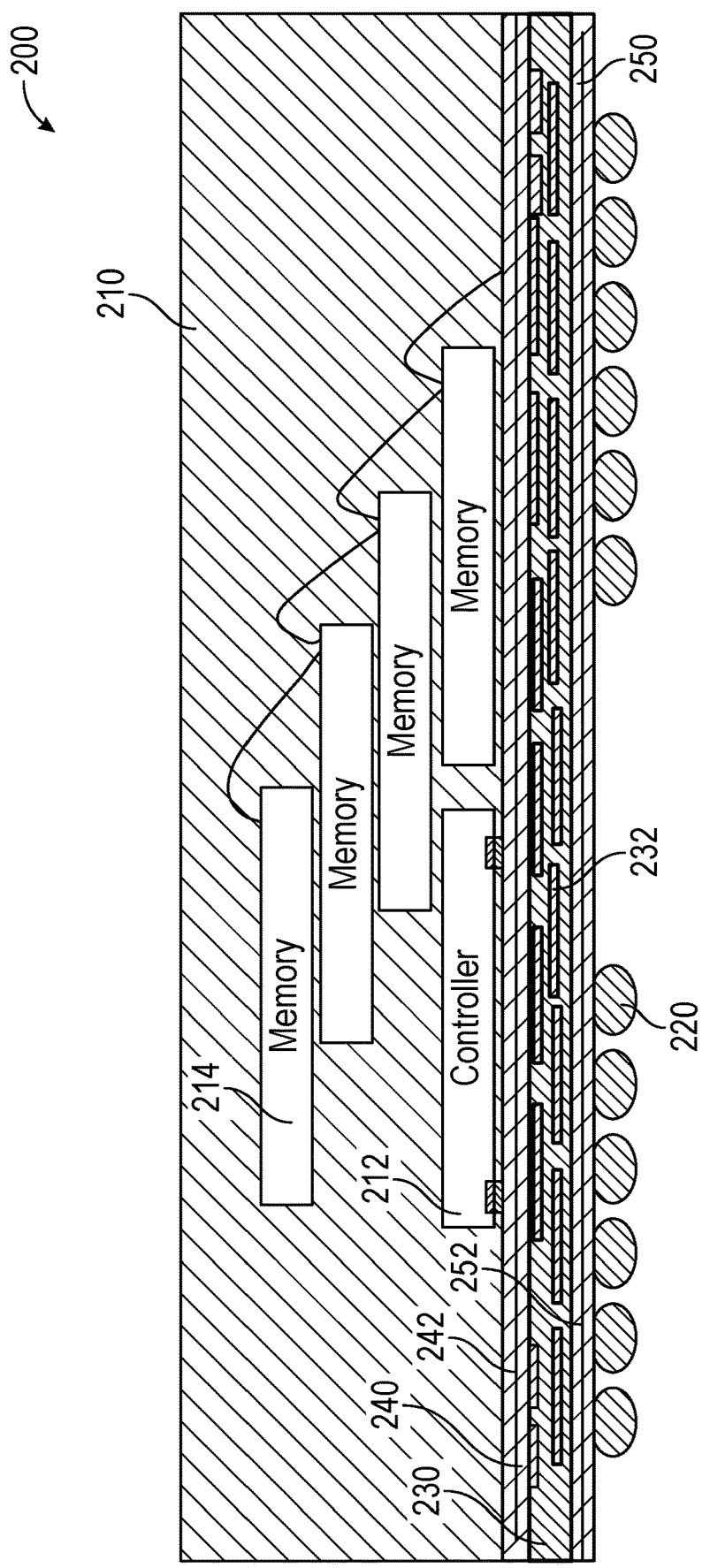
FIG. 2 is a diagram of an example physical assembly of the memory sub-system with an optical waveguide, in accordance with some implementations of the present disclosure.

FIG. 2 is a diagram of an example physical assembly or PCB 200 on which the memory sub-system 110 and the optical waveguide 130 are implemented, in accordance with some implementations of the present disclosure. The PCB 200 includes one or more physical memory components 214 which may implement the memory sub-system 110 and/or the memory components 112A to 112N. The PCB 200 can include one or more physical controller components 212 which implement the memory sub-system controller 115 and/or the host system 120. The one or more physical memory components 214 and the one or more physical controller components 212 are implemented in a stacked arrangement and are coupled to each other via various methods, such as conductive traces and vias in a first layer 210 of the PCB 200.

The PCB 200 includes a second layer 230 that includes one or more conductive traces 232. The one or more conductive traces 232 include various wires and/or vias that interconnect the one or more physical memory components 214 and/or the one or more physical controller components 212 to each other and to various external components to the PCB 200. In some cases, the one or more conductive traces 232 are implemented using solder balls and can be coupled to physical interfaces 220, such as external pins or solder balls of the PCB 200. The one or more conductive traces 232 receive signals from a device external to the PCB 200 via the interface 220.

In some examples, a first protective coating layer 250 is deposited or placed on top of the interface 220. The first protective coating layer 250 can include a first set of optical waveguides 252 of the optical waveguide 130 embedded within the first protective coating layer 250. After the first protective coating layer 250 is deposited on top of the interface 220, the second layer 230 including the one or more conductive traces 232 is formed or deposited on top of the first protective coating layer 250. After the second layer 230 is formed or deposited, a second protective coating layer 240 is deposited or placed on top of the second layer 230. The second protective coating layer 240 can include a second set of optical waveguides 242 of the optical waveguide 130 embedded within the first protective coating layer 250.

The second set of the optical waveguides 242 and the first set of optical waveguides 252 can be implemented using the same type and form of optical fibers as each other or can differ from each other. For example, the optical waveguides 242 can be implemented using a grid arrangement of optical fibers and the optical waveguides 252 can be implemented using a horizontal and/or vertical only arrangement of optical fibers. The quantity of optical fibers included in the optical waveguides 242 can differ from the quantity of optical fibers included in the optical waveguides 252. The optical waveguides 252 can be used to detect disruptions in a light beam that passes through the optical waveguides 252 to identify and/or locate physical faults in the first protective coating layer 250 and/or a bottom portion of the second layer 230. The optical waveguides 242 can be used to detect disruptions in a light beam that passes through the optical waveguides 242 to identify and/or locate physical faults in the second protective coating layer 240 and/or a top portion of the second layer 230.

Figure 3A:
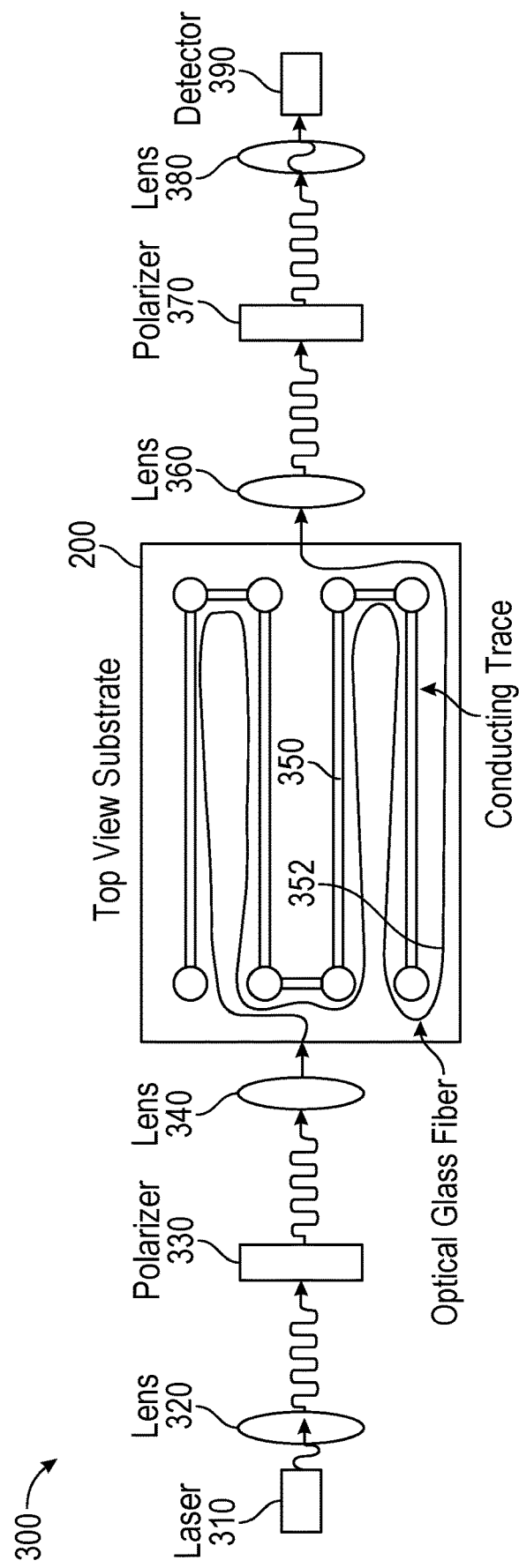
FIG. 3A is a block diagram of an example physical assembly of a system for using an optical waveguide to detect physical faults in a PCB, in accordance with some implementations of the present disclosure.

FIG. 3A is a block diagram of an example physical assembly 300 of the PCB 200 including the optical waveguide shown in FIG. 2, in accordance with some implementations of the present disclosure. FIG. 3A shows a top view or perspective of PCB 200. As shown in FIG. 3A, a laser 310 is positioned to generate one or more light beams with a particular frequency and/or intensity. The beam of light from the laser 310 is passed through a first lens 320 to be directed to a polarizer 330. The polarizer 330 polarizes the beam of light and passes the polarized beam of light to a second lens 340. The second lens 340 can be an active lens or static lens that directs the polarized beam of light to each fiberoptic cable or wire included in the optical waveguide 130.

For example, the light output by the second lens 340 is directed to the optical waveguides 242 including one or more fiberoptic cables 352. In some cases, the one or more fiberoptic cables 352 are placed on a layer above or below one or more conductive traces 350. The formation or direction and positioning of the one or more fiberoptic cables 352 can correspond or mirror or resemble the direction and formation of the one or more conductive traces 350. Namely, the path of the one or more conductive traces 350 can be mirrored by the path of the one or more fiberoptic cables 352. This allows cracks to be identified and detected in critical regions of the PCB 200 (or substrate) on which the one or more conductive traces 350 and the one or more fiberoptic cables 352 are implemented.

Specifically, the light is output by the one or more fiberoptic cables 352 and is received by the third lens 360. The third lens 360 can also be an active or static lens positioned to receive a beam of light from each fiberoptic cable of the one or more fiberoptic cables 352 and to direct such a beam of light to a polarizer 370. The output of the polarizer 370 is passed through a fourth lens 380 and directed to a detector 390. The detector 390 is configured to measure one or more characteristics of the beam of light that exits the optical waveguide 130 and to compare the characteristics of the beam of light to the beam of light that entered the optical waveguide 130. The detector 390 can identify one or more fiberoptic cables in which the one or more characteristics (e.g., the attenuation and/or frequency) of the beam of light changed by more than a threshold (e.g., the change in characteristics transgress the threshold). In some cases, the detector 390 can identify which fiberoptic cable includes a change to the characteristics of the beam of light relative to other fiberoptic cables in the optical waveguide 130. The detector 390 can then identify the physical location of the physical fault which caused the change in beam characteristics, such as using a time of flight measurement.

Figure 3B:
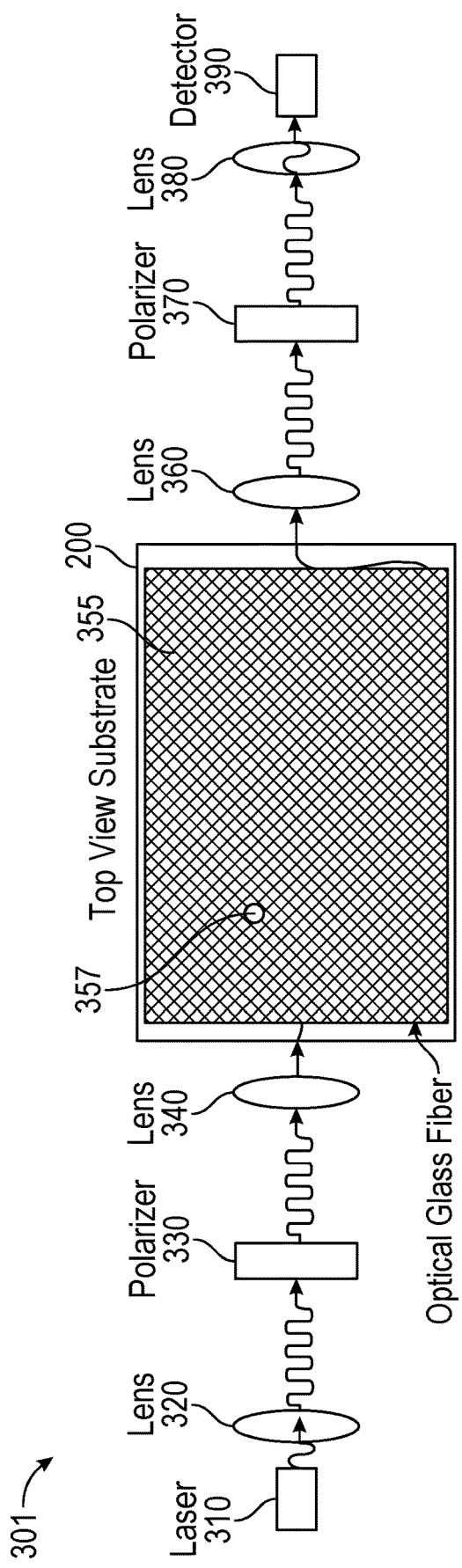
FIG. 3B is a block diagram of an example physical assembly of a system for using an optical waveguide to detect physical faults in a PCB, in accordance with some implementations of the present disclosure.

In some cases, the optical waveguide 130 embedded in the protective layer includes a grid or other geometric pattern of fiberoptic cables. Namely, as shown in the diagram 301 of FIG. 3B, the one or more fiberoptic cables 352 is implemented as a grid of fiberoptic cables 355. The detector 390 can identify a pair of fiberoptic cables, such as in different planes or axes, that include similar changes in beam characteristics relative to other fiberoptic cables of the optical waveguide 130. Namely, the detector 390 can determine that a first fiberoptic cable that runs along the horizontal axis of the optical waveguide 130 includes a change in the beam characteristics that transgresses a threshold. In addition, the detector 390 can determine that a second fiberoptic cable that runs along the vertical axis of the optical waveguide 130 includes a similar or related change in the beam characteristics that transgresses the threshold. The detector 390 can identify a point of intersection 357 of the first and second fiberoptic cables. The detector 390 can determine that the physical fault in the protective coating is present in a region corresponding to the intersection 357.

Figure 4A:
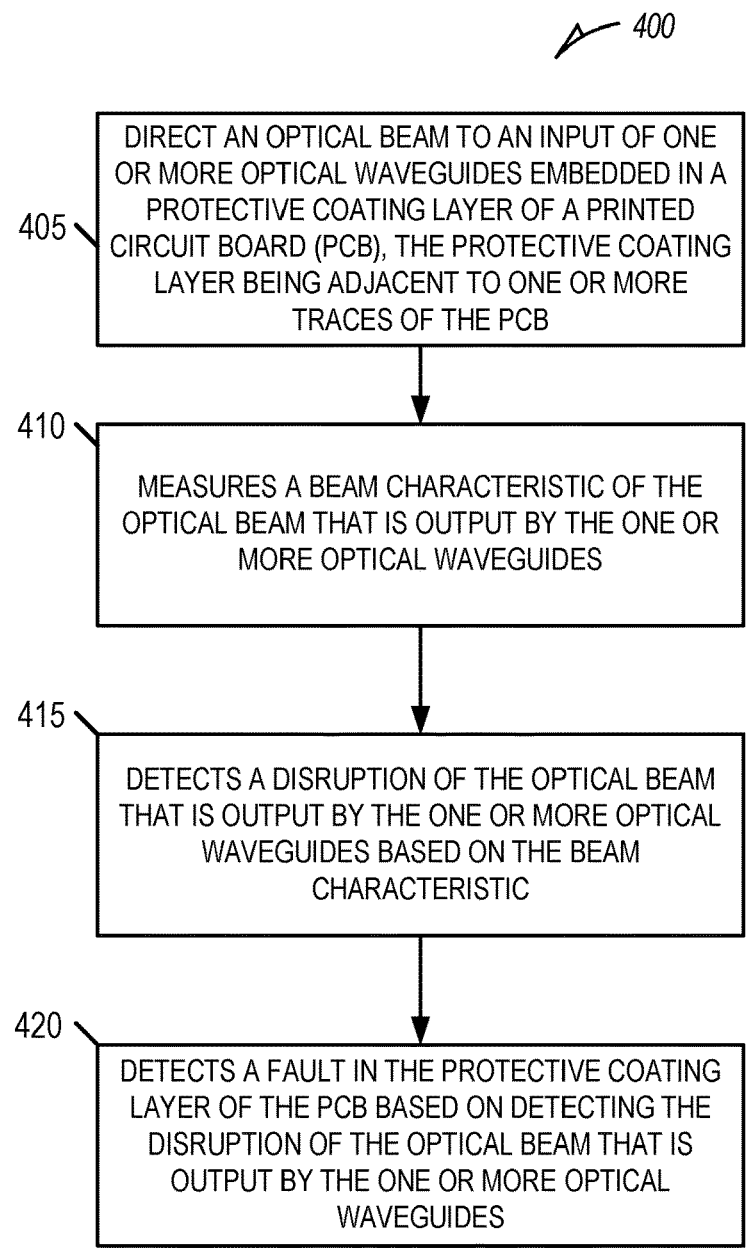
FIG. 4A is a flow diagram of an example method to detect physical faults in a PCB using an optical waveguide, in accordance with some implementations of the present disclosure.

FIG. 4A is a flow diagram of an example method 400 to detect physical faults in a PCB using an optical waveguide, in accordance with some implementations of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the physical fault detection unit 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 4A, the method (or process) 400 begins at operation 405, with a physical fault detection unit 122 of a memory sub-system (e.g., memory sub-system 110) directing an optical beam to an input of one or more optical waveguides embedded in a protective coating layer of a printed circuit board (PCB), the protective coating layer being adjacent to one or more traces of the PCB. Then, the physical fault detection unit 122 measures a beam characteristic of the optical beam that is output by the one or more optical waveguides at operation 410. At operation 415, the physical fault detection unit 122 detects a disruption of the optical beam that is output by the one or more optical waveguides based on the beam characteristic. The physical fault detection unit 122, at operation 420, detects a fault in the protective coating layer of the PCB based on detecting the disruption of the optical beam that is output by the one or more optical waveguides.

Figure 4B:
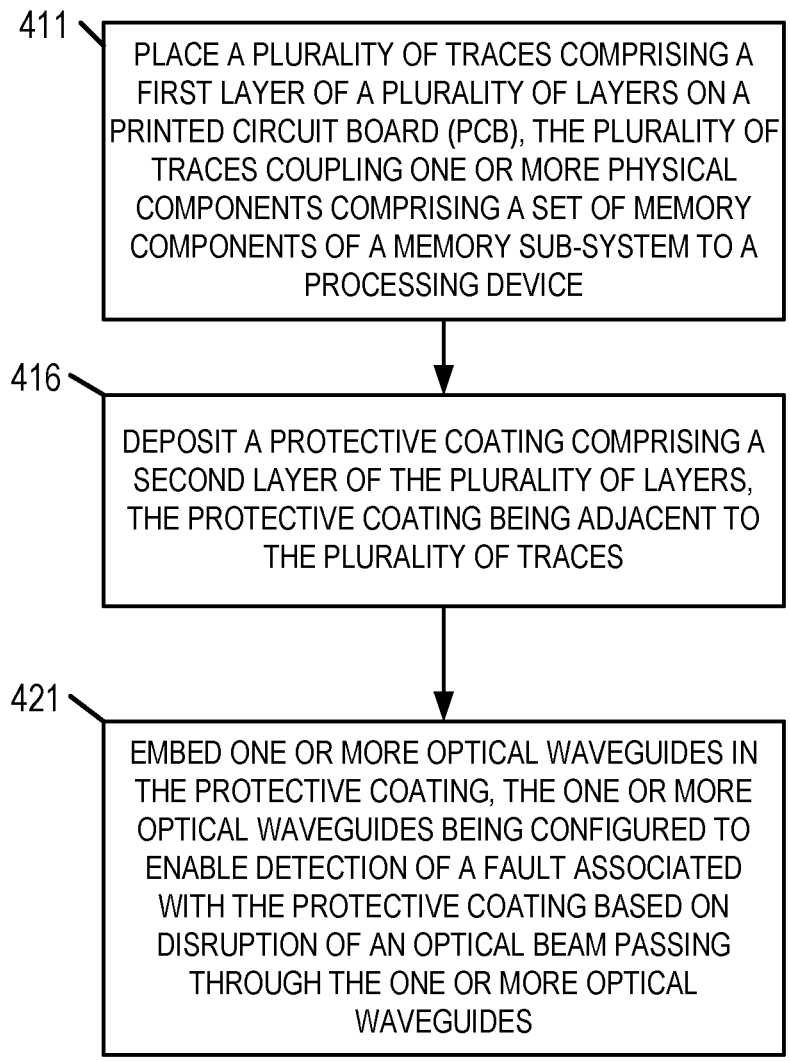
FIG. 4B is a flow diagram of an example method to manufacture a PCB with an optical waveguide, in accordance with some implementations of the present disclosure.

FIG. 4B is a flow diagram of an example method to manufacture a PCB with an optical waveguide, in accordance with some implementations of the present disclosure. The method 401 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 4B, the method (or process) 401 begins at operation 411, where a plurality of traces including a first layer of a plurality of layers are placed on the PCB. The plurality of traces couple one or more physical components including a set of memory components of the memory sub-system 110 to a processing device. Then, a protective coating including a second layer of the plurality of layers is deposited at operation 416. The protective coating can be adjacent to the plurality of traces and, at operation 421, one or more optical waveguides are embedded in the protective coating. The one or more optical waveguides can be configured to enable detection of a fault associated with the protective coating based on disruption of an optical beam passing through the one or more optical waveguides.

In view of the disclosure above, various examples are set forth below. It should be noted that one or more features of an example, taken in isolation or combination, should be considered within the disclosure of this application.

Example 1. A system comprising: a printed circuit board (PCB) comprising a plurality of layers; a plurality of traces comprising a first layer of the plurality of layers, the plurality of traces coupling one or more physical components comprising a set of memory components of a memory sub-system to a processing device; a protective coating comprising a second layer of the plurality of layers, the protective coating being adjacent to the plurality of traces; and one or more optical waveguides embedded in the protective coating, the one or more optical waveguides being configured to enable detection of a fault associated with the protective coating based on disruption of an optical beam passing through the one or more optical waveguides.

Example 2. The system of Example 1, wherein the one or more physical components and the processing device are on a third layer of the plurality of layers, the third layer being adjacent to the protective coating.

Example 3. The system of Example 2, wherein the one or more physical components and the processing device are arranged in a stack.

Example 4. The system of any one of Examples 1-3, wherein the fault comprises a crack in the protective coating.

Example 5. The system of any one of Examples 1-4, wherein the fault comprises a crack in the plurality of traces.

Example 6. The system of any one of Examples 1-5, wherein the protective coating comprises a solder mask layer.

Example 7. The system of any one of Examples 1-6, comprising: an additional set of optical waveguides embedded in an additional protective coating comprising a third layer of the plurality of layers.

Example 8. The system of Example 7, wherein the plurality of traces is physically between the second layer and the third layer.

Example 9. The system of any one of Examples 1-8, comprising: a laser for generating the optical beam; a first lens for receiving the optical beam from the laser and passing the optical beam to a polarizer; and a second lens for receiving the optical beam passing through the polarizer for directing the optical beam to an input of the one or more optical waveguides.

Example 10. The system of Example 9, comprising: a third lens for receiving the optical beam that is output from the one or more optical waveguides; and a sensor for receiving the optical beam that passes through the third lens, the sensor being configured to detect the disruption of the optical beam relative to the optical beam generated by the laser.

Example 11. The system of Example 10, wherein the sensor is configured to perform operations comprising: measuring a time of flight of the optical beam; and determining a physical location of the fault based on the time of flight of the optical beam.

Example 12. The system of any one of Examples 10-11, wherein the one or more optical waveguides comprise a plurality of optical waveguides, and wherein the sensor is configured to perform operations comprising: measuring a frequency or attenuation of the optical beam received from each of the plurality of optical waveguides; determining that the frequency or attenuation of the optical beam output by an individual optical waveguide of the plurality of optical waveguides differs from the frequency or attenuation of the optical beam output by remaining optical waveguides of the plurality of optical waveguides; and identifying a physical location of the fault based on physical positioning of the individual optical waveguide based on determining that the frequency or intensity of the optical beam output by the individual optical waveguide differs from the frequency or intensity of the optical beam output by the remaining optical waveguides.

Example 13. The system of any one of Examples 10-13, wherein the one or more optical waveguides comprise a grid of optical waveguides, and wherein the sensor is configured to perform operations comprising: measuring a frequency or attenuation of the optical beam received from each of the grid of optical waveguides; determining that the frequency or attenuation of the optical beam output by a pair of individual optical waveguides of the plurality of optical waveguides differs from the frequency or attenuation of the optical beam output by remaining optical waveguides of the plurality of optical waveguides; and identifying a physical location of the fault based on physical positioning of a point of intersection between the pair of optical waveguides.

Example 14. The system of any one of Examples 1-13, wherein the one or more optical waveguides are placed in regions of the PCB associated with greater likelihoods of faults.

Example 15. The system of any one of Examples 1-14, wherein the one or more optical waveguides comprise one or more glass fibers.

Example 16. A method comprising: directing an optical beam to an input of one or more optical waveguides embedded in a protective coating layer of a printed circuit board (PCB), the protective coating layer being adjacent to one or more traces of the PCB; measuring a beam characteristic of the optical beam that is output by the one or more optical waveguides; detecting a disruption of the optical beam that is output by the one or more optical waveguides based on the beam characteristic; and detecting a fault in the protective coating layer of the PCB based on detecting the disruption of the optical beam that is output by the one or more optical waveguides.

Example 17. The method of Example 16, wherein the fault comprises a crack in the protective coating.

Example 18. The method of any one of Examples 16-17, wherein the protective coating comprises a solder mask layer.

Example 19. The method of any one of Examples 16-18, comprising: generating the optical beam by a laser; passing the optical beam through a first lens and then through a polarizer; and passing the optical beam output by the polarizer through a second lens to direct the optical beam to the input of the one or more optical waveguides.

Example 20. A method of manufacturing a printed circuit board (PCB) comprising a memory system, the method comprising: placing a plurality of traces comprising a first layer of a plurality of layers on the PCB, the plurality of traces coupling one or more physical components comprising a set of memory components of a memory sub-system to a processing device; depositing a protective coating comprising a second layer of the plurality of layers, the protective coating being adjacent to the plurality of traces; and embedding one or more optical waveguides in the protective coating, the one or more optical waveguides being configured to enable detection of a fault associated with the protective coating based on disruption of an optical beam passing through the one or more optical waveguides.

Methods and computer-readable storage medium with instructions for performing any one of the above examples.

Figure 5:
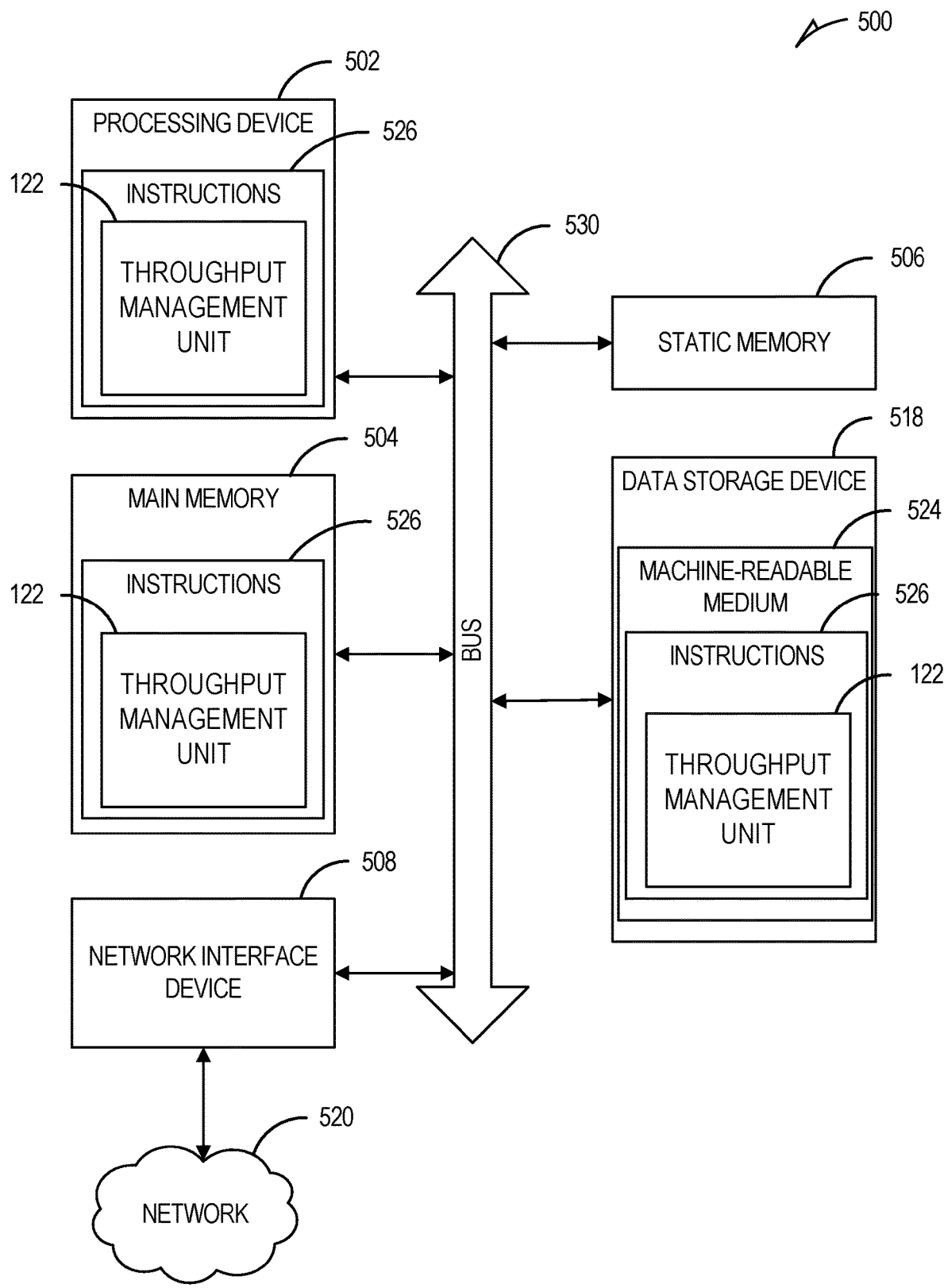
FIG. 5 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the physical fault detection unit 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 implement functionality corresponding to the physical fault detection unit 122 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a method according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising: a printed circuit board (PCB) comprising a plurality of layers; a plurality of traces comprising a first layer of the plurality of layers, the plurality of traces coupling one or more physical components comprising a set of memory components of a memory sub-system to a processing device; a protective coating comprising a second layer of the plurality of layers, the protective coating being adjacent to the plurality of traces; one or more optical waveguides embedded in the protective coating, the one or more optical waveguides being configured to enable detection of a fault associated with the protective coating based on disruption of an optical beam passing through the one or more optical waveguides; and an additional set of optical waveguides embedded in an additional protective coating comprising a third layer of the plurality of layers, wherein the plurality of traces is physically between the second layer and the third layer.

2. The system of claim 1, wherein the one or more physical components and the processing device are on a third layer of the plurality of layers, the third layer being adjacent to the protective coating.

3. The system of claim 2, wherein the one or more physical components and the processing device are arranged in a stack.

4. The system of claim 1, wherein the fault comprises a crack in the protective coating.

5. The system of claim 1, wherein the fault comprises a crack in the plurality of traces.

6. The system of claim 1, wherein the protective coating comprises a solder mask layer.

7. The system of claim 1, comprising: a laser for generating the optical beam; a first lens for receiving the optical beam from the laser and passing the optical beam to a polarizer; and a second lens for receiving the optical beam passing through the polarizer for directing the optical beam to an input of the one or more optical waveguides.

8. The system of claim 7, comprising: a third lens for receiving the optical beam that is output from the one or more optical waveguides; and a sensor for receiving the optical beam that passes through the third lens, the sensor being configured to detect the disruption of the optical beam relative to the optical beam generated by the laser.

9. The system of claim 8, wherein the sensor is configured to perform operations comprising: measuring a time of flight of the optical beam; and determining a physical location of the fault based on the time of flight of the optical beam.

10. The system of claim 8, wherein the one or more optical waveguides comprise a plurality of optical waveguides, and wherein the sensor is configured to perform operations comprising: measuring a frequency or attenuation of the optical beam received from each of the plurality of optical waveguides; determining that the frequency or attenuation of the optical beam output by an individual optical waveguide of the plurality of optical waveguides differs from the frequency or attenuation of the optical beam output by remaining optical waveguides of the plurality of optical waveguides; and identifying a physical location of the fault based on physical positioning of the individual optical waveguide based on determining that the frequency or intensity of the optical beam output by the individual optical waveguide differs from the frequency or intensity of the optical beam output by the remaining optical waveguides.

11. The system of claim 8, wherein the one or more optical waveguides comprise a grid of optical waveguides, and wherein the sensor is configured to perform operations comprising: measuring a frequency or attenuation of the optical beam received from each of the grid of optical waveguides; determining that the frequency or attenuation of the optical beam output by a pair of individual optical waveguides of the plurality of optical waveguides differs from the frequency or attenuation of the optical beam output by remaining optical waveguides of the plurality of optical waveguides; and identifying a physical location of the fault based on physical positioning of a point of intersection between the pair of optical waveguides.

12. The system of claim 1, wherein the one or more optical waveguides are placed in regions of the PCB associated with greater likelihoods of faults.

13. The system of claim 1, wherein the one or more optical waveguides comprise one or more glass fibers.

14. A method of manufacturing a printed circuit board (PCB) comprising a memory system, the method comprising: placing a plurality of traces comprising a first layer of a plurality of layers on the PCB, the plurality of traces coupling one or more physical components comprising a set of memory components of a memory sub-system to a processing device; depositing a protective coating comprising a second layer of the plurality of layers, the protective coating being adjacent to the plurality of traces; embedding one or more optical waveguides in the protective coating, the one or more optical waveguides being configured to enable detection of a fault associated with the protective coating based on disruption of an optical beam passing through the one or more optical waveguides; and embedding an additional set of optical waveguides in an additional protective coating, the additional protective coating comprising a third layer of the plurality of layers, wherein the plurality of traces is physically between the second layer and the third layer.

* * * * *